United States Patent
Mizobuchi

[11] Patent Number: 5,888,895
[45] Date of Patent: Mar. 30, 1999

[54] METHOD FOR MAKING TITANIUM POLY-SILICIDE CMOS CIRCUIT CONTACTS

[75] Inventor: Koichi Mizobuchi, Tsukuba, Japan

[73] Assignee: Texas Instruments Incorporated, Dallas, Tex.

[21] Appl. No.: 978,093

[22] Filed: Nov. 25, 1997

Related U.S. Application Data

[63] Continuation of Ser. No. 469,974, Jun. 6, 1995, abandoned.

[51] Int. Cl.[6] .................................................... H01L 21/28
[52] U.S. Cl. ......................... 438/621; 438/637; 438/649; 438/655; 438/657
[58] Field of Search ..................... 438/586, 630, 438/649, 655, 664, 683, 360, 621, 637, 233

[56] References Cited

U.S. PATENT DOCUMENTS

| | | | |
|---|---|---|---|
| 4,522,845 | 6/1985 | Powell et al. | 427/531 |
| 4,818,723 | 4/1989 | Yen | 438/649 |
| 4,873,205 | 10/1989 | Critchlow et al. | 438/630 |
| 4,966,868 | 10/1990 | Murali et al. | 437/193 |
| 5,138,432 | 8/1992 | Stanasolovich et al. | 357/71 |
| 5,141,890 | 8/1992 | Haken | 437/44 |
| 5,196,360 | 3/1993 | Dean et al. | 438/586 |
| 5,210,043 | 5/1993 | Hosaka | 437/30 |
| 5,369,055 | 11/1994 | Chung | 437/200 |
| 5,381,040 | 1/1995 | Sun et al. | 257/774 |
| 5,427,981 | 6/1995 | Choi | 437/195 |
| 5,525,543 | 6/1996 | Chen | 437/190 |
| 5,550,409 | 8/1996 | Yamaguchi et al. | 257/757 |

OTHER PUBLICATIONS

S. M. Sze, Physics of Semiconductor Devices, 1981 John Wiley & Sons, pp. 245–307.

M. S. Ameen et al., Characterization of Titanium Thin Films Deposited by Plasma–Enhanced Chemical Vapor Deposition, Advanced Metalization for ULSI Applications, Oct. 1994, 6 pages.

C. Arena et al., CVD of Ti and TiN: Electrical Performs as a Contact Metallurgy Oct. 4–6, 1994, Advanced Metalization for ULSI Applications, 2 pages.

*Primary Examiner*—T. N. Quach
*Attorney, Agent, or Firm*—Jacqueline J. Garner; W. James Brady, III; Richard L. Donaldson

[57] ABSTRACT

In order to form an ohmic contacts to both the n+ and the p+ doped regions of complementary metal oxide semiconductor substrate regions of the an integrated circuit device, wells (contact holes) are formed in the insulating using a hard mask poly-Si layer on an insulating region exposing the doped substrate regions. A $TiSi_x$ layer is formed on the walls and base of the well either by physical vapor deposition or is formed by combining a layer of poly-Si with a layer of Ti. The $TiSi_2$ is diffused into the doped region during an annealing step. In addition, the $TiSi_2$ layer is converted into the low resistivity C54 configuration in an annealing step.

8 Claims, 4 Drawing Sheets

METHOD FOR MAKING TITANIUM POLY-SILICIDE CMOS CIRCUIT CONTACTS

This application is a Continuation of application Ser. No. 08/469,974 field Jun. 6, 1995.

BACKGROUND OF THE INVENTION

1. Field of the Invention

This invention relates generally to the fabrication of integrated circuit devices and, more particularly, to the formation of circuit contacts in dynamic random access memory (DRAM) integrated circuit devices.

2. Description of the Related Art

The development of dynamic random access memory devices has now progressed through several generations. Each succeeding generation of DRAM devices has provided more storage capacity and has provided integrated circuit components which have smaller dimensions than the prior generations. This continuing development of the DRAM technology is generally referred to as higher scale integration. The increased scale integration has necessitated a variety of design changes. One of the changes has been the introduction of a "capacitor over bit line" (COB) memory cell structure. The COB memory cell structure replaced the "capacitor under bit line" (CUB) structure which uses aluminum and tungsten in the fabrication of the bit lines. Processes which are performed after the fabrication of the bit lines are characterized as low temperature processes, processes having a maximum temperature of approximately 450° C.

Designs of DRAM units which include the COB structure avoid the use of metal bit lines because of metal bit line oxidation processes in the temperature range of 800° C.–900° C. This temperature range is used in the fabrication of capacitors, gate oxides and interlayer insulators. Consequently, the bit lines in the COB devices are fabricated using poly-silicon (poly-Si) and poly-side (WSi or $TiSi_x$) materials. Although the poly-silicon and the poly-side materials can be fabricated to provide acceptable bit lines within the memory cell array, these materials cannot be used to make contacts with the peripheral circuits because the peripheral circuits are fabricated in complementary metal oxide semiconductor (CMOS) technology. Thus, some devices are connected to p-type regions in the substrate and some devices are connected to n-type regions in the substrate. The poly-silicon materials and the poly-side materials are doped in order to provide proper conductivity. The doping results in diode structure between the contacts and doped regions having an opposite polarity in the substrate. This diode structure cannot provide the functionality of the ohmic contact required for the connection between the bit lines and doped regions.

A need has therefore been felt for materials capable of making an ohmic contact with the metal which avoids the oxidation problem and which does not require impurity doping to achieve good conductivity.

SUMMARY OF THE INVENTION

The aforementioned and other features are accomplished, according to the present invention, by forming a $TiSi_2$ layer covering the well (or contact hole) exposing the doped region in the substrate. The portion of the $TiSi_2$ layer, covering the exposed substrate surface, is then diffused into a p+ or n+ diffused region of the substrate during an annealing process. An annealing process is also used insure that the $TiSi_2$ is converted into the low resistivity C54 structure. The $TiSi_2$ layer can be applied to the well as $TiSi_x$, by a physical vapor deposition process or can be applied as a layer of poly-Si followed by a layer of Ti either by chemical vapor deposition or by physical vapor deposition). In the latter case, the Ti and the Si layers combine to form $TiSi_x$ during an annealing process, and after etching of the unwanted by products of the $TiSi_x$ formation, the C54 $TiSi_2$ structure can be formed during a second annealing process.

These and other features of the present invention will be understood upon reading of the following description in conjunction with the Figures.

DESCRIPTION OF THE PREFERRED EMBODIMENT(S)

1. Detailed Description of the Drawings

Figure 1:
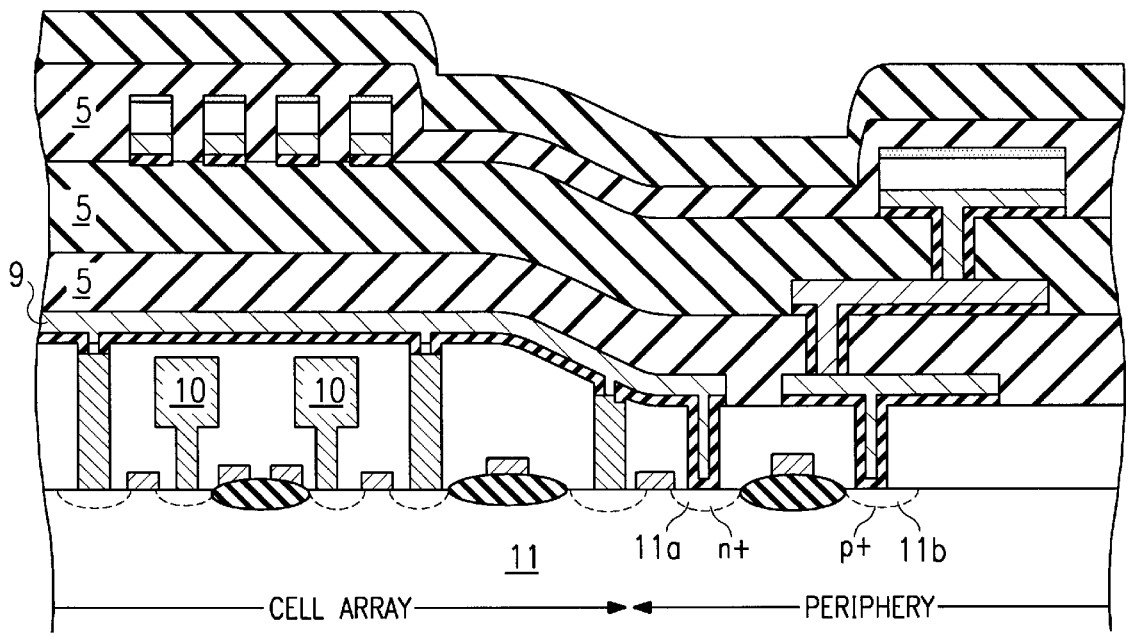
FIG. 1 is a cross-sectional view of a portion of an integrated circuit memory device having a "capacitor under bit line" configuration.
Figure 2:
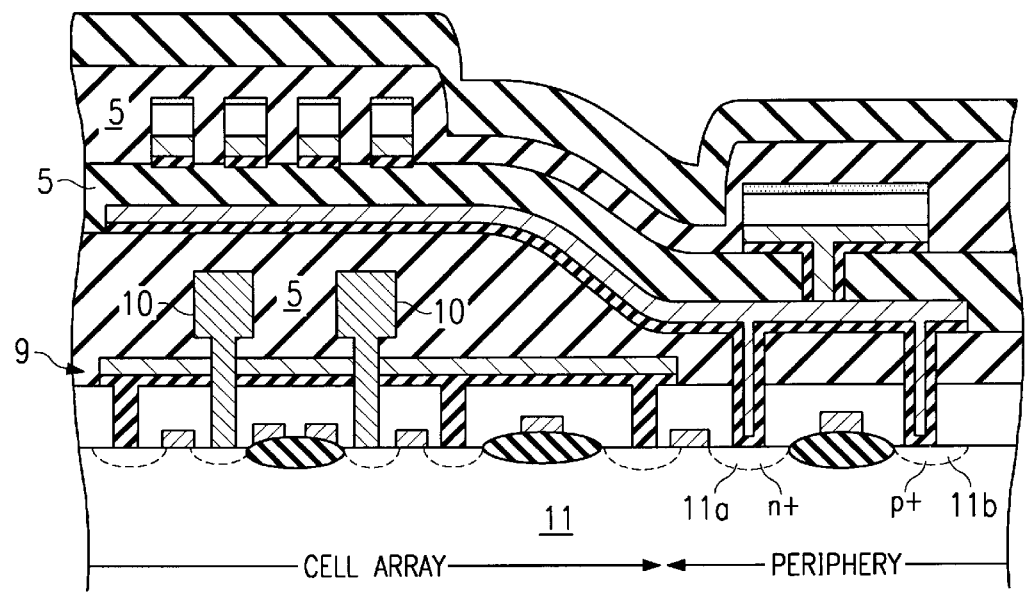
FIG. 2 is a cross-sectional view of a portion of an integrated circuit memory device having a "capacitor over bit line" configuration.

Referring to FIGS. 1 and 2, cross-sectional views illustrating the difference between the integrated circuit device configuration for the capacitor under bit line (CUB) implementation and the capacitor over bit line (COB) implementation are shown. The position of the capacitors 10 relative to the bit lines 9 identify the CUB implementation as opposed to the CUB implementation. Also illustrated in these Figures is the fact that the circuits in the periphery of the device have both n+-doped regions 11a and p+-doped regions 11b in the substrate of the device. The metal inter-layer oxide regions 5 provide the electrical insulation between conducting materials.

Figure 3A:
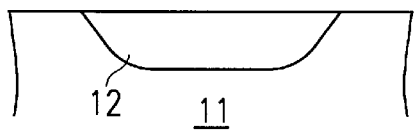
FIGS. 3a through 3j illustrate the steps of a first process for providing a titanium poly-silicide electrical contact to doped regions in the complementary metal oxide semiconductor substrate.
Figure 3B:
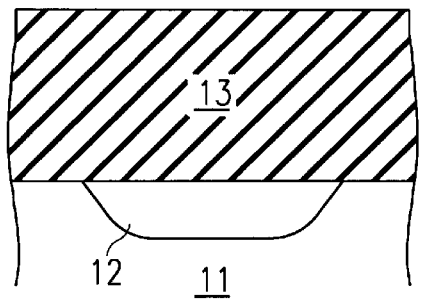
Figure 3C:
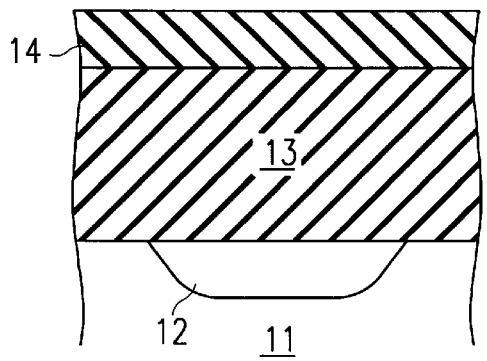
Figure 3D:
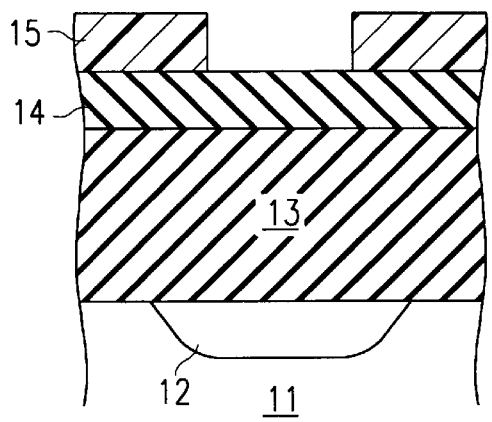
Figure 3E:
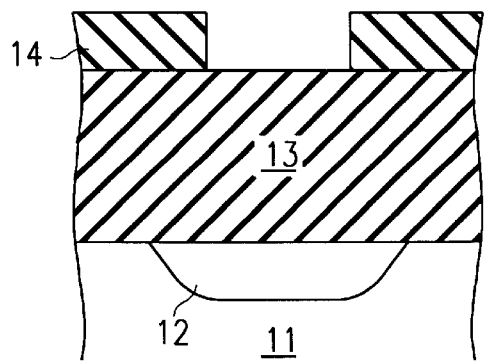
Figure 3F:
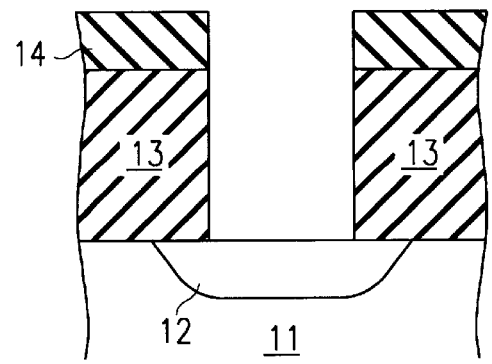
Figure 3G:
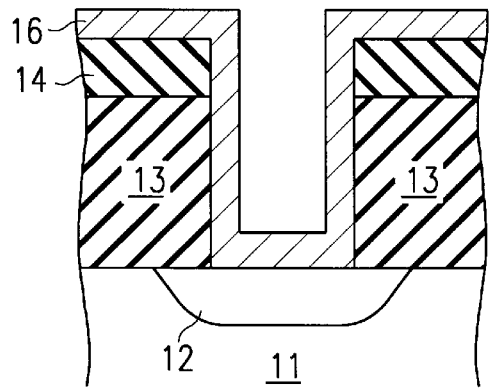
Figure 3H:
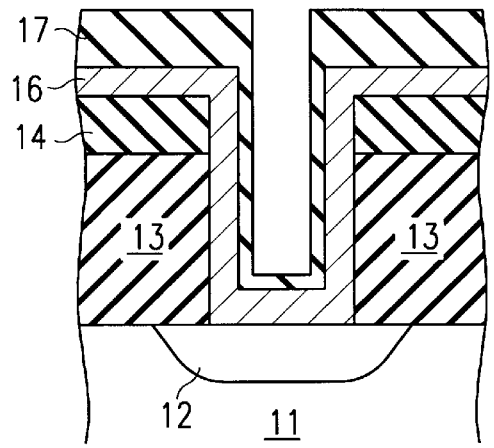
Figure 3I:
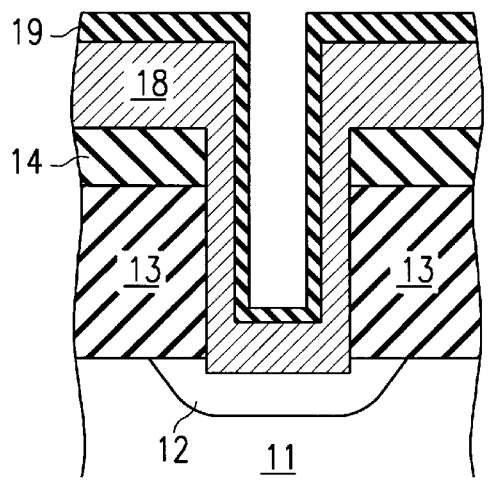
Figure 3J:
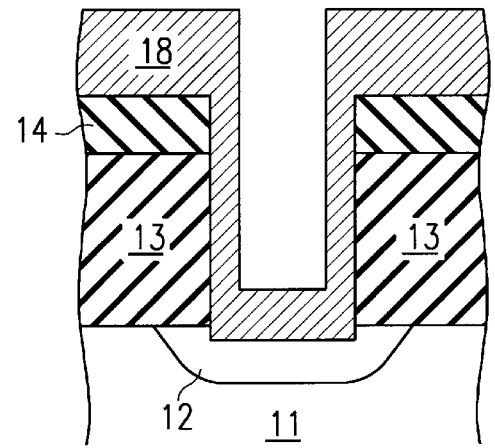

Referring to FIG. 3a, a (n+- or p+-) doped region 12 is formed in a semiconductor substrate 11. In FIG. 3b, an insulator region 13 ($SiO_2$) is formed over the doped region 12 and the substrate 11. A non-doped poly-Si layer 14 is formed over the insulating layer 13 in FIG. 3c, while a patterned layer of photo resist material 15 is formed over the non-doped poly-Si layer 14 in FIG. 3d. In FIG. 3e, the poly-Si layer is etched as determined by the pattern of the photoresist material 15 and the photo resist material 15 is etched away. Using the poly-Si 14 as a mask, a contact etch contact holes in the in the $SiO_2$ layer 13, exposing the doped region 12 of the substrate 11 in FIG. 3f. In FIG. 3g, a layer 16 of non-doped poly-Si is formed over the exposed surfaces of the non-doped poly-Si 14, over the exposed contact hole surfaces of the $SiO_2$ and over the exposed surface of the doped substrate region 12. In FIG. 3h, a layer of titanium 17 is formed over the non-doped poly-Si layer 16. The device is heated in an atmosphere of $N_2$ or $H_2+N_2$ to form a layer 18 of $TiSi_x$, which is covered by a layer of TiN(Ti) 19 in FIG. 3i. In FIG. 3j, the TiN(Ti) layer 19 has been removed. Thereafter, the conducting material can be formed on the $TiSi_2$ material and a wiring layer formed.

Figure 4A:
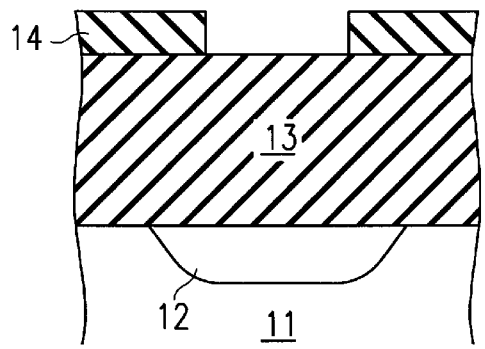
FIGS. 4a through 4d illustrate the steps of a second process for providing a titanium poly-silicide electrical contact to doped regions in the complementary metal oxide semiconductor substrate.
Figure 4B:
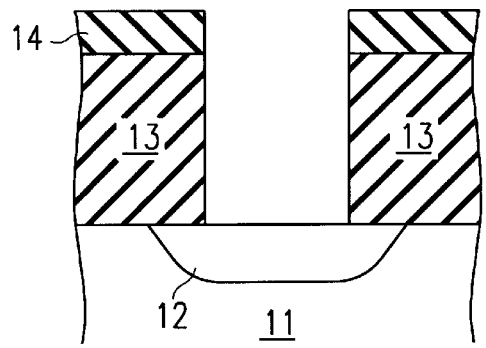
Figure 4C:
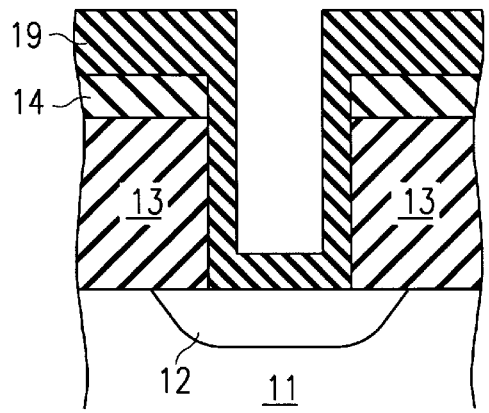
Figure 4D:
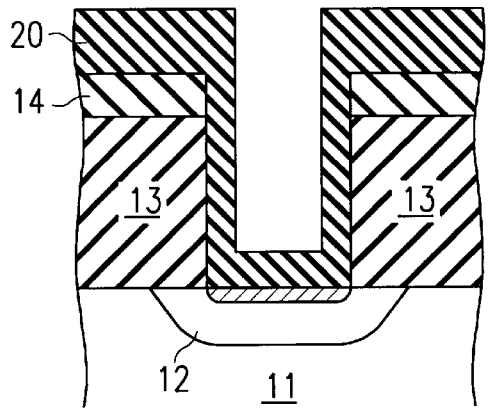

Referring to FIGS. 4a–4d, FIG. 4a corresponds to FIG. 3e wherein an insulating layer 13 has been formed over substrate 11 and diffused region 12. A patterned non-doped poly-Si layer 14 has been formed over the insulating layer 13. In FIG. 4b, a etching step forms a well in the insulating layer 13, exposing an area on the surface of diffused region 12. In FIG. 4c, a TiSi$_x$ layer is applied to the non-doped poly-Si layer 14, the exposed surfaces of the insulating layer 13 well, and the exposed surface of the diffused layer 12. After the bit line and the periphery conducting paths are merged, patterned, and etched, a annealing step will diffuse the TiSi$_2$ into the diffused layer 12 providing an ohmic contact.

2. Operation of the Preferred Embodiment(s)

In the preferred embodiment illustrated in FIGS. 3a–3j, the non-doped poly-Si layer 16, formed with a 100% coverage over the non-doped poly-Si hard mask 14 and the SiO$_2$ well sides, is provided by a SiH$_4$ gas at 530° C. and the resulting thickness is less than 200 Angstroms. The Ti layer 17 can be formed using conventional physical vapor deposition or using chemical vapor deposition. The physical vapor deposition is performed at a temperature of 200° C.–300° C. with a pressure of less than 5 mTorr, a flow of less than 30 standard cm$^3$/minute, and a power of 8 KW. The TiSi$_2$ layer 18 is formed from the poly-Si layer 16 and the Ti layer 17 during an annealing process. The TiSi$_2$ layer 18 (having a high resistivity C49 structure) is formed by annealing the device at a temperature of approximately 550° C. to 600° C. in a N$_2$ or N$_2$+H$_2$ atmosphere. The annealing process also causes the TiSi$_2$ layer to diffuse into the diffused substrate region 12. A second anneal, performed after an unwanted layer of TiN has been etched off, is performed at 700° C. to 750° C. and causes the TiSi$_2$ to assume the low resistivity C54 structure.

The present invention permits the formation of relatively low resistivity ohmic contacts to both n+ doped regions and p+ doped regions of the substrate implemented in CMOS technology by means of a single group of process steps. The incomparability of the temperatures, the materials, and the procedures for making electrical contacts found in the related art is therefore overcome by the present process.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is intended that the claims shall cover all modifications and applications as do not depart from the spirit and scope of the invention.

What is claimed is:

1. A method for providing an ohmic contact to n+ or p+ doped regions in a substrate exposed by a bottom of a contact hole in an insulating layer of an integrated circuit, said method comprising the steps of:

forming a poly-Si layer over exposed bottom and side surfaces of said contact hole;

forming a Ti layer over said poly-Si layer in said contact hole;

annealing said poly-Si layer and said Ti layer in an atmosphere of N$_2$ or H$_2$+N$_2$ gas to form a TiSi$_2$ layer covered by a TiN layer, wherein during said annealing step TiSi$_2$ material diffuses into said doped regions exposed by said contact hole and removing said TiN, layer.

2. The method of claim 1 further comprising the step of:

forming said contact hole in said insulating layer using a poly-Si mask.

3. The method of claim 2 further comprising the step of:

forming said poly-Si mask by patterning and etching a poly-Si layer.

4. The method of claim 1 further including the step of annealing said ohmic contact to convert said TiSi$_2$ layer from a C49 structure to a C54 structure.

5. A method for providing ohmic contacts to n+ and p+ regions of a substrate of an integrated circuit device, said method comprising the steps of:

fabricating a well in an insulating layer covering said substrate, a bottom of said well exposing said regions of said substrate; and forming a layer of TiSi$_2$ over said region and sides of said well, wherein said TiSi$_2$ layer is formed by annealing in an atmosphere of N$_2$ or H$_2$+N$_2$ gas a non-doped poly-Si layer formed over exposed surfaces of said well and a Ti layer formed on said non-doped poly-Si layer, wherein said annealing step results in diffusion of said TiSi$_2$ into said doped regions.

6. The method of claim 5 further including a stripping step to remove non-TiSi$_2$ components remaining after the formation of said TiSi$_2$ layer.

7. The method of claim 6 further comprising a second annealing step, said second annealing step converting said TiSi$_2$ structure from a C49 structure to a C54 structure.

8. The method of claim 5 wherein said fabricating a well step includes the steps of:

forming an insulating layer over said substrate;

forming a non-doped poly-Si layer over said insulating layer;

patterning and etching said non-doped poly-Si layer to expose a selected surface of said insulating layer; and forming said well by etching a region of said insulating layer under a one of said selected surfaces.

* * * * *